US006857388B2

United States Patent
Lee et al.

(10) Patent No.: US 6,857,388 B2
(45) Date of Patent: Feb. 22, 2005

(54) COLD WALL CHEMICAL VAPOR DEPOSITION APPARATUS WITH A HEATER CONTROL UNIT

(75) Inventors: Tae-Wan Lee, Seoul (KR); Kyu-Jin Choi, Seoul (KR); Yong-Ho Lee, Gyeonggi-do (KR)

(73) Assignee: Jusung Engineering Co., LTD (KR)

( * ) Notice: Subject to any disclaimer, the term of this patent is extended or adjusted under 35 U.S.C. 154(b) by 217 days.

(21) Appl. No.: 10/124,252

(22) Filed: Apr. 17, 2002

(65) Prior Publication Data

US 2002/0152959 A1 Oct. 24, 2002

(30) Foreign Application Priority Data

Apr. 18, 2001 (KR) ........................................ 2001-20847

(51) Int. Cl.[7] ........................... C23C 16/00; H01L 21/00
(52) U.S. Cl. ................................... 118/723 E; 118/725
(58) Field of Search ............................ 118/723 E, 725; 156/345.43, 345.44, 345.45, 345.46, 345.47, 345.52, 345.54, 345.27

(56) References Cited

U.S. PATENT DOCUMENTS

| | | | |
|---|---|---|---|
| 4,673,588 A | * | 6/1987 | Bringmann et al. ........ 427/489 |
| 5,350,480 A | * | 9/1994 | Gray ...................... 156/345.26 |
| 5,372,648 A | * | 12/1994 | Yamamoto et al. ....... 118/723 E |
| 5,376,213 A | * | 12/1994 | Ueda et al. ............ 156/345.27 |
| 5,688,331 A | * | 11/1997 | Aruga et al. ................. 118/725 |
| 5,778,968 A | * | 7/1998 | Hendrickson et al. ..... 165/80.1 |
| 6,110,322 A | * | 8/2000 | Teoh et al. ............ 156/345.52 |
| 6,135,052 A | * | 10/2000 | Fujii et al. ............... 118/723 E |
| 6,328,802 B1 | * | 12/2001 | Miller et al. ................. 118/712 |

FOREIGN PATENT DOCUMENTS

| JP | 11150073 | 2/1999 |
|---|---|---|
| KR | 19951878 | 1/1995 |

* cited by examiner

Primary Examiner—Gregory Mills
Assistant Examiner—Michelle Crowell
(74) Attorney, Agent, or Firm—Duane Morris LLP

(57) ABSTRACT

A cold wall chemical vapor deposition apparatus includes: a chamber; a susceptor movable up and down in the chamber by a driving means, the susceptor including a heater and an internal electrode; a heat reflector over the susceptor, the heat reflector reflecting a heat emitted from the heater back to a wafer on the susceptor and serving as an correspondent electrode to the internal electrode; a heater control unit connected to the wafer, the heater and the driving means, the heater control unit sensing a temperature of the wafer, the susceptor moving according to the temperature; a gas supply unit supplying gases to the chamber; and a power source applying a voltage to the chamber.

5 Claims, 3 Drawing Sheets

COLD WALL CHEMICAL VAPOR DEPOSITION APPARATUS WITH A HEATER CONTROL UNIT

This application claims the benefit of Korean Patent Application No. 2001-20847, filed on Apr. 18, 2001 in Korea, which is hereby incorporated by reference for all purposes as if fully set forth herein.

BACKGROUND OF THE INVENTION

1. Field of the Invention

The present invention relates to an apparatus for manufacturing semiconductor and more particularly, to a cold wall chemical vapor deposition apparatus and a cleaning method of a chamber for the same.

2. Discussion of the Related Art

A development for a new material has been actively performed in the field and diverse large-scale integrated circuit (LSI) such as ultra large-scale integrated circuit (ULSI) has been developed thanks to a rapid growth of the new material development. That is, because the new material for forming thin films such as an insulating layer, a semi-conductor layer and a conductor layer, which constitute a semi-conductor device, has been developed widely in the field, the large-scale integrated circuit (LSI) such as the ultra large-scale integrated (ULSI) circuit is available now. As the society proceeds to the information age, an electric goods, which has a low weight, a small size and a thin dimension, has been required in the field. Because structural elements of the semi-conductor device requires a high reliability, a thin film forming method, which satisfies conditions such as a uniform deposition, a superior step coverage and a complete removal of particles, is required. Accordingly, many thin film deposition methods such as a chemical vapor deposition (CVD) method and a physical vapor deposition (PVD) method have been developed in the field.

Because the chemical vapor deposition method has many advantages compared with other deposition methods, it has usually been used for a manufacturing method of the semi-conductor device. A selective epitaxial growth (SEG) method in which a thin film is formed by growing a crystal grain selectively on a particular region of a substrate using the chemical vapor deposition method, is used in a manufacturing process for an integrated circuit such as the large-scale integrated circuit (LSI) or above the large scale integrated circuit (LSI). The selective epitaxial growth method is now used particularly in the integrated circuit manufacturing process in which an insulating film such as silicon oxide ($SiO_2$) or silicon nitride ($Si_3N_4$) is formed in line patterns on a silicon substrate and a silicon film is selectively accumulated in an exposed region of the silicon substrate.

FIG. 1 is a schematic plan view of a conventional hot wall chemical vapor AFT deposition apparatus. The hot wall chemical vapor deposition apparatus 2 is one of apparatuses that perform the selective epitaxial growth process of the silicon. The hot wall chemical vapor deposition apparatus 2 includes a chamber 4 and a wall of the chamber 4 is heated by three-zone resistance heater 6. A forming process of the silicon thin film on a wafer in the hot wall chemical vapor deposition apparatus is as follows. First, a wafer is loaded into the chamber 4 of the hot wall chemical vapor deposition apparatus 2 and subsequently source gas, which will grow into the thin film, is supplied into the chamber 4. The chamber 4 is then heated by the three-zone resistance heater 6. The silicon thin film is subsequently formed on the wafer by growing silicon crystals on the wafer under high temperature condition in the chamber 4. At this time, because the wall of the chamber 4 is heated to a high temperature, the source gas is undesirably deposited thin on an inner surface of the chamber wall. The deposition of the source gas on the inner surface of the chamber 4 has disadvantages as followings. First, it increases a loss of material due to an unintentional deposition. Second, a rupture of the chamber 4 may occur when the chamber 4 is cooled down after a completion of the depositing process because of a contraction ratio difference between the chamber wall and the thin film deposited on the chamber wall. Third, because interior condition of the chamber 4 is under high temperature, the source gas such as silane ($SiH_4$) or disilane ($Si_2H_6$), which is deposited on the chamber inner wall, is actively gasified and thus decreases a growing speed of the silicon crystal on the insulating film such as silicon oxide ($SiO_2$) or silicon nitride ($Si_3N_4$). For this reason, it is difficult to grow the silicon crystal over 500 Å under the condition like this. Therefore, a cold wall chemical vapor deposition apparatus has been suggested to overcome these problems.

The cold wall chemical vapor deposition apparatus includes a chamber and a susceptor in the chamber. The susceptor includes a heater in it. After an interior of the chamber is vacuumed, the heater of the susceptor is turned on to heat up the susceptor. When the susceptor is heated by the heater, the wafer on the susceptor is also heated indirectly.

FIG. 2 is a cross-sectional view illustrating a conventional cold wall chemical vapor deposition apparatus. The conventional cold wall chemical vapor deposition apparatus 20 includes a chamber 22, exhaust units 28 and 30 and a gas supply unit 24. The chamber 22 is a place where the thin film deposition is performed and is electrically grounded. The susceptor 36 is positioned in the chamber 22 and the wafer 34, which is formed of silicon material, is loaded on the susceptor 36. The exhaust units 28 and 30 are for exhausting the air in the chamber 22. The gas supply unit 24 is for storing the source gas and providing the source gas into the chamber 22. The exhaust units 28 and 30 consist of a first exhaust unit 30 and a second exhaust unit 28. The first exhaust unit 30 is for whole region of the interior of the chamber 22 and the second exhaust unit 28 is mainly for a surrounding of the susceptor 36. An ultra-high vacuum (UHV) exhaust system, which uses a turbo molecular pump, is included in the exhaust units 28 and 30 and thus the interior of the chamber 22, particularly the surrounding of the susceptor 36 where the thin film deposition process is performed, comes to be in ultra high vacuum state. The susceptor 36 is fixed to a bottom of the chamber 22 and the wafer 34 on which the thin film is to be deposited is put on the susceptor 36. The susceptor 36 is generally made of silicon material, which is also a material for the wafer, such as graphite or silicon carbide (SiC), for example, not to damage the wafer 34. The susceptor 36 includes the heater 37 and an internal electrode 38. A heat reflector 32 is formed over the susceptor 36 with same material as the thin film on the wafer 34. The heat reflector 32 reflects a radiant heat that is emitted from the wafer 34 and the susceptor 36 back to the wafer 34 to improve a heating efficiency for the wafer 34 in the chamber 22. The thin film material is undesirably deposited on the heat reflector 32 as well as on the wafer during the thin film depositing process, and accordingly the heat reflector 32 is formed of the same material as the thin film material on the wafer 34 to prevent the thin film material deposited on the heat reflector 32 from being easily separated away from the heat reflector 32. A radio-frequency (RF) electrode 33, which serves to form an electric field between the radio-frequency (RF) electrode 33 and the internal electrode 38 by a radio-frequency (RF) power supply 35, is formed in the heat reflector 32. The cold wall chemical vapor deposition apparatus 20 may further include a refrigerating device to cool down the wall of the chamber 22.

The thin film deposition process in the cold wall chemical vapor deposition apparatus will be described hereinafter with reference to FIG. 2 and FIG. 3. The wafer 34 is carried into the chamber 22 from outside through a slot valve 26 and then is loaded onto the susceptor 36. The interior state of the chamber 22 subsequently becomes an ultra high vacuum state of $10^{-8}$ Torr by the first exhaust unit 30 and the second exhaust unit 28. Because the susceptor 36 was already heated by the heater 37 before the loading of the wafer on the susceptor 36, the wafer 34 is heated up to a certain temperature, usually about 700° C., and then the source gas is supplied into the chamber 22 through the gas supply unit 24. At this time, the interior of the chamber 22 is under the ultra high vacuum state and accordingly the source gas reaches the wafer 34 by being scattered in the chamber 22. Because the wafer 34 was heated up by the heater 37 in the susceptor 36, the source gas is resolved into its components as it reaches a surface of the wafer 34 and then deposited on the wafer 34. A line pattern is usually formed on the surface of the wafer 34 using the insulating film such as silicon oxide ($SiO_2$) film or silicon nitride ($Si_3N_4$) film, for example. The surface of the wafer 34 includes a surface region where the silicon, which is the material for the wafer 34, is exposed to the air and a surface region where the insulating film such as silicon oxide ($SiO_2$) film or silicon nitride ($Si_3N_4$) film is exposed to the air. Because the reaction rate on the silicon surface is much faster than the reaction rate on the silicon oxide ($SiO_2$) film surface or the silicon nitride ($Si_3N_4$) film surface, the silicon is selectively accumulated only on the silicon surface of the wafer 34.

The cold wall chemical vapor deposition apparatus 20 in which the silicon crystals are selectively grown on the surface of the wafer 34, has a few disadvantages as followings. First, the thin film may not be formed on the surface of the wafer uniformly due to an irregular heating of the wafer 34. That is, the cold wall chemical vapor deposition apparatus includes only the heater 37 in the susceptor 36 for its heating source and accordingly there occurs a temperature difference between a top surface of the wafer 34 and a bottom surface of the wafer 34. This temperature difference between the top surface and the bottom surface causes an irregular temperature distribution through the whole wafer 34 and thus causes a different silicon crystal growth depending on a region of the wafer 34. Because a deposition speed of the source gas on the wafer surface is in proportion to the temperature of the wafer 34, the different temperature distribution of the wafer 34 causes that the thin film is not formed uniformly on the wafer 34. If other elements are already formed on the wafer 34, the irregular deposition phenomenon becomes more serious because of a step of other elements. For example, a deposition speed of polysilicon shows a 2.0 to 2.5 percent difference when there is a temperature difference of 1° C. FIG. 3 is a graph illustrating a temperature difference between the wafer 34 and a cold wall in a conventional cold wall chemical vapor deposition apparatus 20. As shown in the figure, a temperature of the cold wall is usually maintained at about 20° C. and a temperature of the susceptor 36 is usually maintained at about 700° C. Accordingly, there is a temperature difference of 25° C. between the top surface and the bottom surface of the wafer 34, which contacts the susceptor 36.

Another disadvantage of the cold wall chemical vapor deposition apparatus 20 is that the thin film may also be formed undesirably on the heat reflector 32 and then separated away from the heat reflector 32 serving as a contaminating material. That is, if a thickness of the thin, which is deposited on the heated reflector 32 during a repeated deposition process, becomes thick, the deposited thin film on the heat reflector 32 comes to be separated away from the heat reflector 32 due to its weight and floats around as particles in a shape of dust in the chamber 22. If these particles of the separated thin film sticks to the elements on the wafer 34, they act as impurities and thus lower a reliability of the elements of the wafer 34.

SUMMARY OF THE INVENTION

Accordingly, the present invention is directed to a cold wall chemical vapor deposition apparatus and a cleaning method of a chamber for the same that substantially obviates one or more of problems due to limitations and disadvantages of the related art.

An advantage of the present invention is to provide a cold wall chemical vapor deposition apparatus in which a susceptor can move up and down during thin film deposition process to overcome irregular thin film deposition on a wafer and to provide a heat reflector on which a window that is coated or formed with quartz or silicon oxide ($SiO_2$) is formed.

Another advantage of the present invention is to provide a cleaning method of a chamber of a cold wall chemical vapor deposition apparatus in which a susceptor moves up and down and a movement direction of cleaning gas such as sulfur hexafluoride ($SF_6$) plasma gas is changed by a switching operation of electrodes to clean the chamber more efficiently than a conventional cleaning method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a cold wall chemical vapor deposition apparatus includes: a chamber; a susceptor movable up and down in the chamber by a driving means, the susceptor including a heater and an internal electrode; a heat reflector over the susceptor, the heat reflector reflecting a heat emitted from the heater back to a wafer on the susceptor and serving as an correspondent electrode to the internal electrode; a heater control unit connected to the wafer, the heater and the driving means, the heater control unit sensing a temperature of the wafer, the susceptor moving according to the temperature; a gas supply unit supplying gases to the chamber; and a power source applying a voltage to the chamber.

In another aspect, a cleaning method of a chamber for a cold wall chemical vapor deposition apparatus, which includes a susceptor having an internal electrode, a heat reflector, a driving means for the susceptor, a power source selectively applying a voltage to the heat reflector or to the internal electrode and a gas supply unit includes: supplying cleaning gas from the gas supply unit to the chamber; applying the voltage to the heat reflector and simultaneously grounding the internal electrode; applying the voltage to the internal electrode and simultaneously grounding the heat reflector; and moving the susceptor up and down by the driving means while the voltage is applied to the heat reflector or to the internal electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

The characteristic of the present invention is that a cold wall chemical vapor deposition apparatus includes a movable susceptor, a heat reflector that has a window on it and a heater control unit. The susceptor of the present invention can move up and down to reduce a temperature difference between a top surface and a bottom surface of a wafer. The window of the heat reflector is formed on the heat reflector to control thin film material not to be deposited on the heat reflector. The heater control unit controls a temperature of the heater and a movement of the susceptor.

Figure 1:
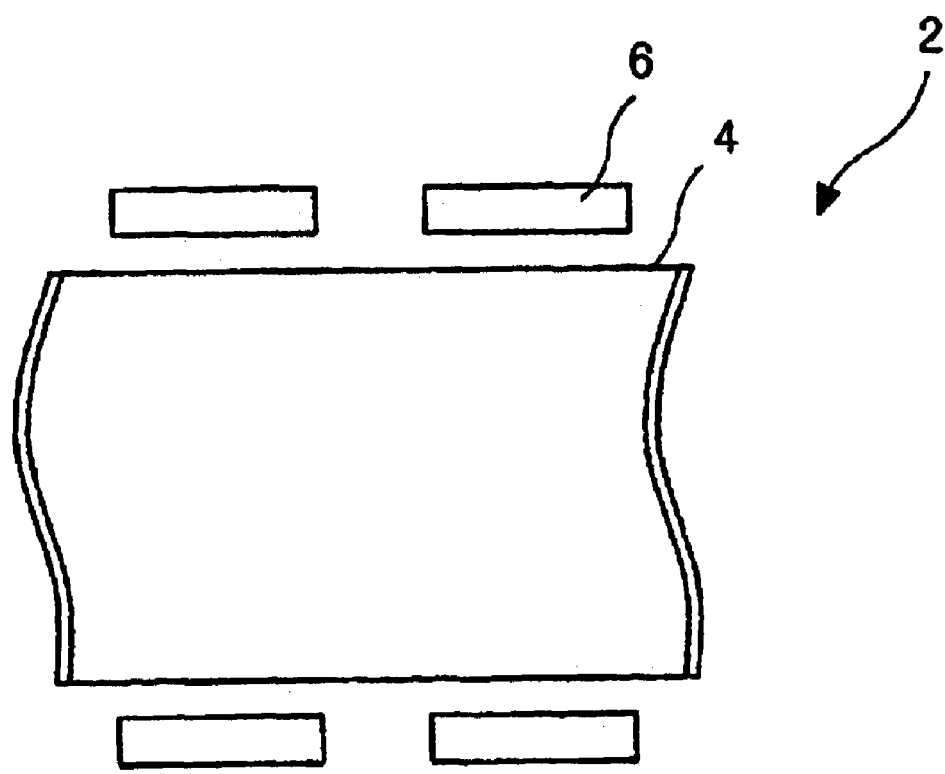
FIG. 1 is a schematic plan view of a conventional hot wall chemical vapor deposition apparatus.
Figure 2:
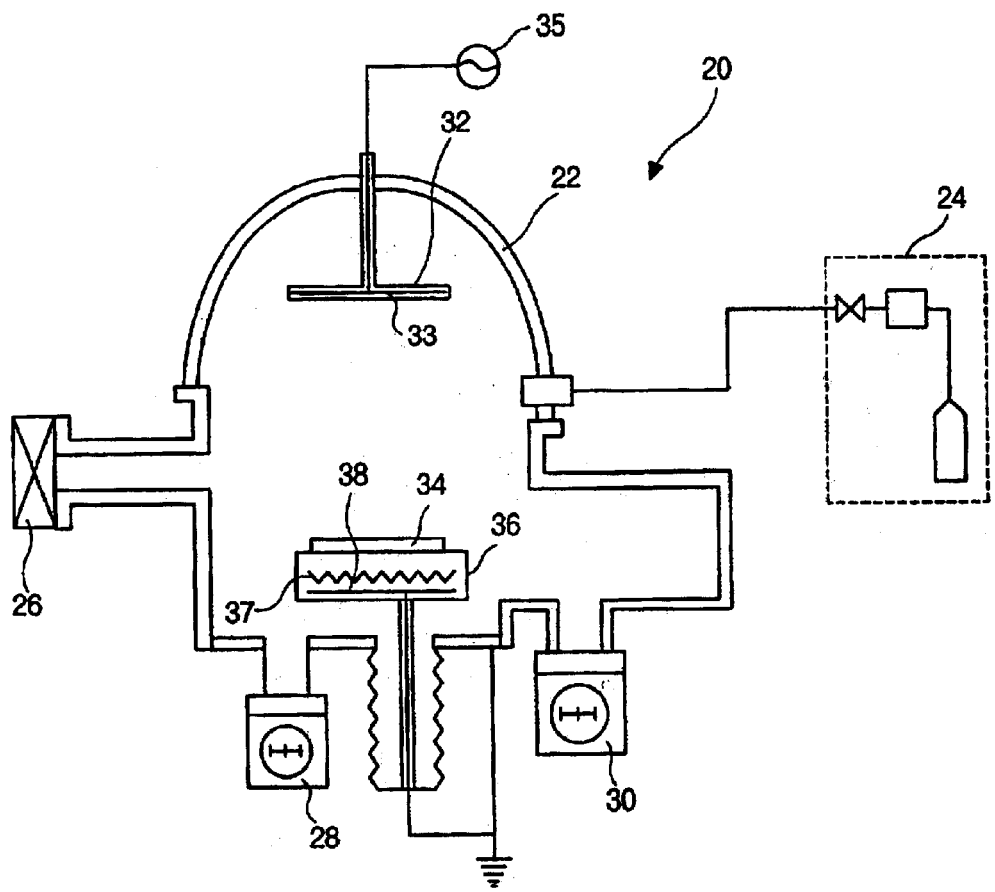
FIG. 2 is a cross-sectional view illustrating a conventional cold wall chemical vapor deposition apparatus.
Figure 3:
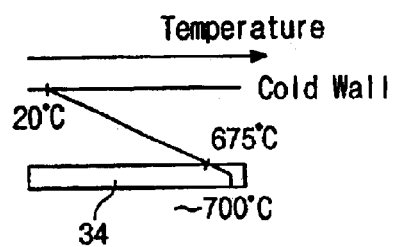
FIG. 3 is a graph illustrating a temperature difference between a wafer and a cold wall in a conventional cold wall chemical vapor deposition apparatus.
Figure 4:
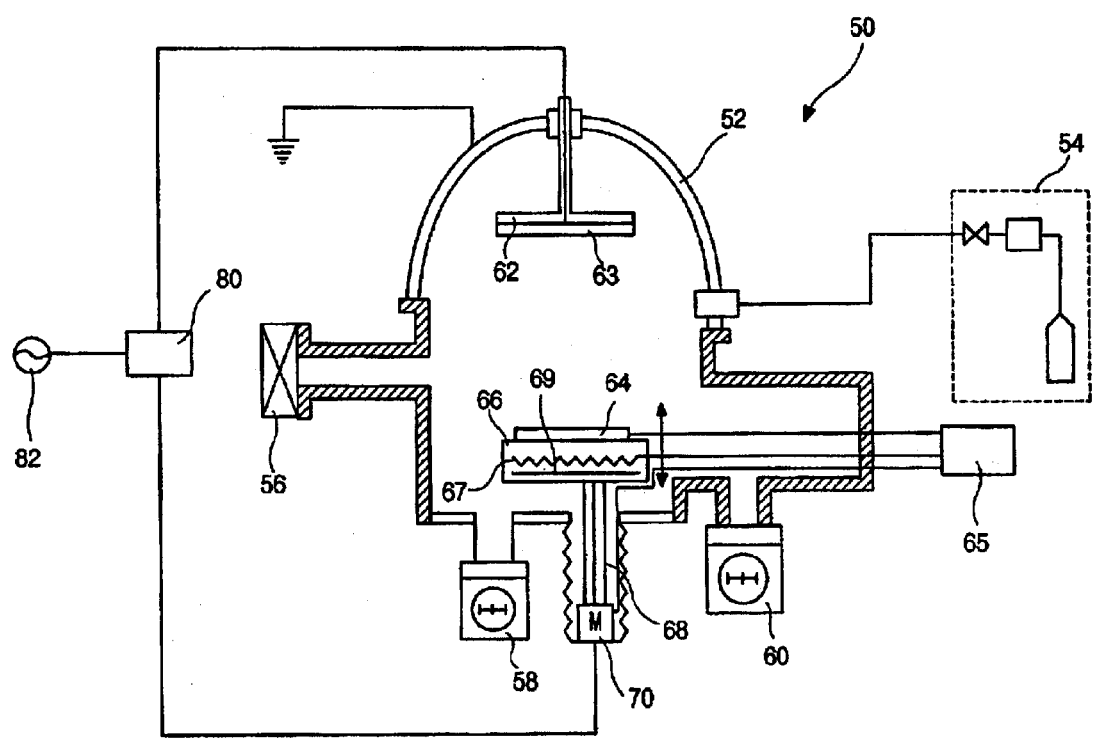
FIG. 4 is a cross-sectional view illustrating a cold wall chemical vapor deposition apparatus according to the present invention.

FIG. 4 is a cross-sectional view illustrating a cold wall chemical vapor deposition apparatus according to the present invention. As shown in the figure, the cold wall chemical vapor deposition apparatus 50 includes a chamber 52, exhaust units 58 and 60 and a gas supply unit 54. The chamber 52 is electrically grounded. The exhaust units 58 and 60 are for exhausting the air in the chamber 52. The gas supply unit 54 is for supplying source gas material into the chamber 52. The exhaust units consist of a first exhaust unit 60 and a second exhaust unit 58. The first exhaust unit 30 is for whole region of an interior of the chamber 52 and the second exhaust unit 58 is mainly for a surrounding of the susceptor 66. An ultra-high vacuum (UHV) exhaust system, which uses a turbo molecular pump, is included in the exhaust units 58 and 60 and thus the interior of the chamber 52, particularly the surrounding of the susceptor 66 where the thin film deposition process is performed, becomes an ultra high vacuum state. The susceptor 66 is positioned in the chamber 52 and supported by a supporter 68. A wafer 64 on which the thin film is deposited is put on the susceptor 66. The susceptor 66 is desirably made of silicon material, which is a material for the wafer, such as graphite or silicon carbide (SiC), for example, not to damage the wafer 64. The susceptor 66 has a heater 67, which is for heating the wafer 64 on the susceptor 66, and an internal electrode 69, which serves as one of electrodes to form an electric filed in the chamber 52. The susceptor 66 can move up and down and the movement of the susceptor 66 is driven by a motor 70 that is connected to the supporter 68. A heat reflector 62 is positioned over the susceptor 66 in the chamber 52 to increase a heating efficiency for the wafer 64 by reflecting a radiant heat that is emitted from the wafer 64 and the susceptor 66 back to the wafer 64. The heat reflector 62 is formed of metal material and serves as another electrode to which a radio-frequency (RF) voltage is applied to form the electric field in the chamber 52. The window 63 is coated or formed with material such as quartz or silicon oxide ($SiO_2$) on the heat reflector 62 to prevent the thin film material from being accumulated on the heat reflector 62. The cold wall chemical vapor deposition apparatus of the present invention further includes a heater control unit 65, which controls a temperature of the heater 67 and the movement of the susceptor 66 upward or downward after sensing a temperature of the wafer 64. The heater control unit 65 may be disposed in the chamber 52 but it is preferable to dispose it outside of the chamber 52.

The electrical structure of the cold wall chemical vapor deposition apparatus will be described hereinafter. The internal electrode 69 of the susceptor 66 and the heat reflector, i.e., an external electrode, are connected to a radio-frequency (RF) power source 82 that is controlled by a switch 80. The switch 80 selectively applies the radio-frequency (RF) voltage to one of electrodes, i.e., the internal electrode 69 or the heat reflector 62, and simultaneously ground the other electrode left. That is, if the radio-frequency voltage is applied to the internal electrode 69, then the heat reflector 62 is grounded and if the radio-frequency voltage is applied to the heat reflector 62, the internal electrode 69 is grounded. A selective application of the radio-frequency (RF) voltage and the grounding is controlled by the switch 80.

A thin film depositing process of the present invention will be described hereinafter with reference to FIG. 4. The wafer 64 is carried into the chamber 52 from outside through a slot valve 56 and then is loaded onto the susceptor 66. The interior state of the chamber 52 subsequently becomes an ultra high vacuum state of $10^{-8}$ Torr by the first exhaust unit 60 and the second exhaust unit 58. Because the susceptor 66 was already heated by the heater 67 before the wafer is loaded on the susceptor 66, the wafer 64 is heated up to a certain temperature, usually about 700° C., and then the source gas is supplied into the chamber 52 through a gas supply unit 54. The source gas can reach the wafer 64 by being scattered in the chamber 52 because the interior of the chamber 52 is under the ultra high vacuum state. At this time because the wafer 64 was already heated up by the heater 67 in the susceptor 66 as mentioned above, the source gas is resolved into its components as it reaches a surface of the wafer 64 and then deposited on the wafer 64. A line pattern is usually formed on a surface of the wafer 64 using the insulating film such as silicon oxide ($SiO_2$) film or silicon nitride ($Si_3N_4$) film, for example. The surface of the wafer 64 includes a surface region where the silicon, which is a material for the wafer 64, is exposed to the air and a surface region where the insulating film such as silicon oxide ($SiO_2$) film or silicon nitride ($Si_3N_4$) film is exposed to the air. Because the reaction rate on the silicon surface is much faster than the reaction rate on the silicon oxide ($SiO_2$) film surface or the silicon nitride ($Si_3N_4$) film surface, the silicon is selectively accumulated only on the silicon surface of the wafer 64.

The cold wall chemical vapor deposition apparatus 50 includes the movable susceptor 66, which moves up and down by the motor 70, and the heater control unit 65, which controls an operation of the motor 70. If a big temperature difference between a top surface of the wafer 64 and a bottom surface of the wafer 64 is sensed by the heater control unit 65, the heater control unit 65 controls the motor 70 to move up the susceptor 66 toward the heat reflector 62 and controls a temperature of the heater 67 to reduce the temperature difference between the top surface of the wafer 64 and the bottom surface of the wafer 64.

On the other hand, if a temperature of the wafer 64 becomes too high, the heater control unit 65 senses this and then controls the motor 70 to move the susceptor 66 down. The heater control unit 65 simultaneously controls the temperature of the heater 67 to let the wafer maintain a proper temperature. That is, the temperature of the wafer 64 can be controlled by the movement of the susceptor 66 and the temperature control of the heater 67 and thus the temperature control of the wafer is much more effective in the present invention compared with the conventional cold wall chemical vapor deposition apparatus in which the temperature control of the wafer is done only by the heater. In addition, because the heat reflector 62 has the window 63 on it and the window 63 is coated or formed using quartz or silicon oxide ($SiO_2$), an undesirable thin film deposition phenomenon on the heat reflector 62 can be decreased remarkably.

A cleaning process of the chamber 52 is performed after the thin film deposition process. The cold wall chemical vapor deposition apparatus of the present invention is also superior in a cleaning process of the chamber. The cleaning process of the chamber 52 according to the present invention will be described hereinafter. The cleaning process of the chamber in the conventional cold wall chemical vapor deposition apparatus is generally performed in a way that an electric field is formed in the chamber by applying the radio-frequency (RF) voltage to the heat reflector and then cleaning gas such as sulfur hexafluoride ($SF_6$) plasma gas is supplied into the chamber. The cleaning process of the present invention is also performed using the cleaning gas such as sulfur hexafluoride ($SF_6$) plasma gas. However, because the susceptor 66 of the present invention is movable up and down, a density and a distribution of the cleaning gas such as sulfur hexafluoride ($SF_6$) plasma gas, which is between the heat reflector 62 and the susceptor 66, can be controlled by the movement of the susceptor 66. Accordingly, the cleaning of the chamber 52 can be performed more efficiently in the present invention than the conventional cold wall chemical vapor deposition apparatus that has a fixed susceptor 66.

As described before, the cold wall chemical vapor deposition apparatus 50 includes two electrodes to form electric field in the chamber, one is the heat reflector 62 and the other is the internal electrode 69. Besides the cold wall chemical vapor deposition apparatus 50 further includes the switch 80. The switch 80 selectively applies the radio-frequency (RF) voltage to one of two electrodes and simultaneously grounds the other electrode left. That is, if the radio-frequency voltage is applied to the internal electrode 69, then the heat reflector 62 is grounded and if the radio-frequency voltage is applied to the heat reflector 62, the internal electrode 69 is grounded. The selective application of the radio-frequency (RF) voltage and the grounding is controlled in this manner by the switch 80. Accordingly, if the switching operation of the electrodes is performed during the cleaning process of the chamber 52, a movement direction of the plasma gas is changed into an opposite direction. If the switching operation of the electrodes is performed repeatedly, the plasma gas, which has an opposite movement direction, can be generated repeatedly in the chamber and accordingly the cleaning of the chamber 52 can be performed more efficiently than a conventional cleaning method that uses a plasma gas moving in a single direction.

It will be apparent to those skilled in the art that various modifications and variation can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A cold wall chemical vapor deposition apparatus, comprising:

a chamber;

a susceptor movable up and down in the chamber by a driving means, the susceptor including a heater and an internal electrode;

a heat reflector over the susceptor, the heat reflector reflecting a heat emitted from the heater back to a wafer on the susceptor and serving as an correspondent electrode to the internal electrode;

a heater control unit connected to the wafer, the heater and the driving means, the heater control unit sensing a temperature of the wafer, the susceptor moving according to the temperature;

a gas supply unit supplying gases to the chamber; and a power source applying a voltage to the chamber.

2. The apparatus according to claim 1, wherein the heat reflector further includes a window coated or formed with material such as silicon oxide ($SiO_2$) beneath the heat reflector.

3. The apparatus according to claim 1, wherein the driving means is a motor.

4. The apparatus according to claim 1, further comprising a switch selectively applying the voltage to the internal electrode or to the heat reflector.

5. The apparatus according to claim 1, further comprising an exhaust unit maintaining a vacuum state of the chamber.

* * * * *